United States Patent
Yoshida et al.

[11] Patent Number: 5,942,836
[45] Date of Patent: Aug. 24, 1999

[54] ENERGY-TRAPPING THICKNESS-SHEAR RESONATOR AND ELECTRONIC COMPONENTS USING THE SAME

[75] Inventors: Ryuhei Yoshida; Daisaku Kugo, both of Toyama; Jiro Inoue, Omihachiman, all of Japan

[73] Assignee: Murata Manufacturing Co., Ltd., Kyoto, Japan

[21] Appl. No.: 08/986,763

[22] Filed: Dec. 8, 1997

[30] Foreign Application Priority Data

Jan. 10, 1997 [JP] Japan ................................. 9-014496

[51] Int. Cl.⁶ ................................................. H01L 41/08
[52] U.S. Cl. ........................ 310/320; 310/368; 310/344
[58] Field of Search ..................... 310/320, 367, 310/368, 358, 344, 348, 365

[56] References Cited

U.S. PATENT DOCUMENTS

| | | | |
|---|---|---|---|
| 4,384,229 | 5/1983 | Inoue et al. | 310/320 X |
| 4,454,444 | 6/1984 | Fujiwara et al. | 310/368 X |
| 4,757,581 | 7/1988 | Yamada et al. | 310/368 X |
| 4,870,313 | 9/1989 | Hirama et al. | 310/320 |
| 5,117,147 | 5/1992 | Yoshida | 310/320 |

FOREIGN PATENT DOCUMENTS

| | | |
|---|---|---|
| 59-148421 | 8/1984 | Japan . |
| 63-206018 | 8/1988 | Japan . |
| 1-103311 | 4/1989 | Japan . |
| 1-171121 | 12/1989 | Japan . |
| 6-125242 | 5/1994 | Japan . |
| 7-226647 | 8/1995 | Japan . |

*Primary Examiner*—Mark U. Budd
*Attorney, Agent, or Firm*—Graham & James LLP

[57] ABSTRACT

An energy-trapping thickness-shear resonator includes a piezoelectric substrate, a first electrode extending from a first end to a central portion of a first surface of the piezoelectric substrate and a second electrode extending from a second end to the central portion of a second surface of the substrate. Thus, the resonator utilizes thickness shear vibrations generated in a portion of the piezoelectric substrate located between the first and second electrodes at the central portion of the substrate. The width W of the la substrate is set to be equal to or less than about 0.7 mm and also to satisfy both of the following expressions (1) and (3) or to satisfy both of the expressions (2) and (3):

(1) $0 < W < k\, T/(1-a)$ (2) $k(2n-1)T/(1-a) < W < k(2n+1)T/(1-a)$ (3) $0\ 21\ \alpha < (fa-fr)/fa$ where T indicates the thickness of the piezoelectric substrate; k is ½; $f_{OSC}$ equals fa $(1-\alpha)$; $f_{OSC}$ represents the oscillation frequency; fa designates the anti-resonant frequency; fr represents the resonant frequency; α is a constant and n indicates a positive integer.

8 Claims, 5 Drawing Sheets

ENERGY-TRAPPING THICKNESS-SHEAR RESONATOR AND ELECTRONIC COMPONENTS USING THE SAME

BACKGROUND OF THE INVENTION

1. Field of the Invention

The present invention broadly relates to energy-trapping thickness-shear resonators and, more particularly, to a structure of a miniaturized energy-trapping thickness-shear resonator.

2. Description of the Related Art

Along with the miniaturization of electronic equipment, in particular, mobile communication equipment, there is an increasing demand for further reducing the size of power supply devices, such as batteries and secondary cells. Moreover, lower-powered oscillators are also required to enable electronic equipment to be used for as long as possible. However, it is difficult to effectively decrease the power consumed in currently available ceramic oscillators because such oscillators tend to be operated at higher frequencies and the inter-terminal capacitance or the load capacitance is comparatively large.

As a type of oscillator described above, an energy-trapping thickness-shear resonator having the structure shown in FIG. 1 is widely used. The resonator A is formed of a thin rectangular piezoelectric substrate 1. In the resonator A shown in FIG. 1, an electrode 2 is arranged to extend from one end to a central portion on one surface of the substrate 1. Another electrode 3 is also arranged to extend from the other end to the central portion of the other surface of the substrate 1. Thus, the electrodes 2 and 3 opposedly face each other at the central portion of the piezoelectric substrate 1, thereby causing thickness shear vibrations.

The inter-terminal capacitance $C_f$ of the resonator A having the structure and arrangement as described above is expressed by the following equation:

$$C_f = \epsilon_0 \epsilon_r \Delta L W / T$$

where $\epsilon_0$ indicates the vacuum dielectric constant; $\epsilon_r$ represents the relative dielectric constant of the constituent material for the piezoelectric substrate; $\Delta L$ designates the length of the overlapping portion of the electrodes 2 and 3; W indicates the width of the piezoelectric substrate 1; and T represents the thickness of the substrate 1.

In the above equation, in order to reduce the capacitance $C_f$, among the elements which determine the capacitance $C_f$, the length $\Delta L$ or the width W is decreased or the thickness T is increased. The thickness T however cannot be easily changed because there is a certain correlation between the thickness T and the oscillation frequency. It is not easy to change the length $\Delta L$, either, because a substantially fixed ratio $\Delta L/T$ is, in general, required for preventing spurious responses from being output from the oscillator. Accordingly, the width W can be most effectively decreased to reduce the capacitance $C_f$.

In known oscillators utilizing thickness shear vibrations as described above, the range of the width W is determined in the following manner. For example, Japanese Unexamined Patent Publication No. 63-206018 discloses an oscillator having a width W ranging of 0.8 mm$\leq$W$\leq$1.4 mm. Also, Japanese Unexamined Utility Model Publication No. 1-171121 discloses an oscillator having a width W ranging of 0.75 mm$\leq$W$\leq$0.90 mm.

However, a large amount of power is still needed even in the oscillators having the ranges of widths W determined in the above manner. Accordingly, it is necessary that the width W be decreased even more. Through a variety of tests concerning the relationship between the width and power used in the oscillators utilizing thickness shear vibrations, the present inventors have discovered a relationship between the width and power as shown in FIG. 2. It should be noted that the data indicated in FIG. 2 was obtained with the condition that $\Delta L/T$ was substantially fixed.

FIG. 2 reveals that power consumption starts to sharply decrease as the width W becomes equivalent to or smaller than approximately 0.7 mm. In the above-described ranges of the width W, however, spurious vibrations may be generated in the frequency band depending on the value of the width W. The spurious vibrations cause abnormal oscillations, such as the case where the oscillation frequency is carried on the frequency of the third-order or fifth-order harmonics of the shear vibrations. In particular, there is a greater likelihood that larger spurious responses are generated in oscillators operated at higher frequencies, thereby preventing such oscillators from being put into practical use.

SUMMARY OF THE INVENTION

To overcome the problems described above, the preferred embodiments of the present invention provide a lower-powered energy-trapping thickness-shear resonator in which spurious responses are eliminated.

According to one preferred embodiment of the present invention, there is provided an energy-trapping thickness-shear piezoelectric resonator including a piezoelectric substrate; a first electrode disposed to extend from one end to a central portion on one surface of the piezoelectric substrate; and a second electrode disposed to extend from the other end to the central portion of the other surface of the piezoelectric substrate, the resonator utilizing thickness shear vibrations generated in a portion of the piezoelectric substrate located between the first and second electrodes at the central portion of the piezoelectric substrate, wherein the width W of the piezoelectric substrate is set to be equal to or less than about 0.7 mm and also to satisfy both of the expressions (1) and (3) or both of the expressions (2) and (3):

(1) $0 < W < k\ T/(1-\alpha)$ (2) $k(2n-1)T/(1-\alpha) < W < k(2n+1)T/(1-\alpha)$ (3) $0 < \alpha < (fa-fr)/fa$ where T indicates the thickness of the piezoelectric substrate; k is ½; $f_{OSC}$ equals fa $(1-\alpha)$; $f_{OSC}$ represents the oscillation frequency; fa designates the anti-resonant frequency; fr represents the resonant frequency; and n indicates a positive integer.

According to another preferred embodiment of the present invention, there is provided an electronic component including an insulating mounting board having two mounting electrodes disposed at least on an upper surface of the board; an energy-trapping thickness-shear piezoelectric resonator including a piezoelectric substrate; a first electrode disposed to extend from one end to a central portion on one surface of the piezoelectric substrate; and a second electrode disposed to extend from the other end to the central portion of the other surface of the piezoelectric substrate, the resonator utilizing thickness shear vibrations generated in a portion of the piezoelectric substrate located between the first and second electrodes at the central portion of the piezoelectric substrate, wherein the width W of the piezoelectric substrate is set to be equal to or less than about 0.7 mm and also to satisfy both of the expressions (1) and (3) or both of the expressions (2) and (3):

(1) $0 < W < kT/(1-\alpha)$ (2) $k(2n-1)T/(1-\alpha) < W < k(2n+1)T/(1-\alpha)$ (3) $0 < \alpha < (fa-fr)/fa$ where T indicates the thickness of the piezoelectric substrate; k is ½; $f_{OSC}$ equals fa $(1-\alpha)$; $f_{OSC}$ represents the oscillation frequency; fa designates the anti-resonant frequency; fr represents the resonant frequency; and n indicates a positive integer, the resonator being mounted on the mounting board so that the first electrode and the second electrode of the resonator are respectively connected to the mounting electrodes of the mounting board; and a cap fixed onto the mounting board to cover the resonator, the mounting electrodes of the mounting board being arranged to extend from an interior of the cap to an exterior of the cap.

According to still another preferred embodiment of the present invention, there is provided an electronic component including an insulating mounting board having first, second and third mounting electrodes disposed at least on an upper surface of the board; an energy-trapping thickness-shear piezoelectric resonator including a substantially rectangular sheet-like piezoelectric substrate; a first electrode disposed to extend from one end to a central portion on one surface of the piezoelectric substrate; and a second electrode disposed to extend from the other end to the central portion of the other surface of the piezoelectric substrate, the resonator utilizing thickness shear vibrations generated in a portion of the piezoelectric substrate located between the first and second electrodes at the central portion of the piezoelectric substrate, wherein the width W of the piezoelectric substrate is set to be equal to or less than about 0.7 mm and also to satisfy both of the expressions (1) and (3) or both of the expressions (2) and (3):

(1) $0 < W < kT/(1-\alpha)$ (2) $k(2n-1)T/(1-\alpha) < W < k(2n+1)T/(1-\alpha)$ (3) $0 < \alpha < (fa-fr)/fa$ where T indicates the thickness of the piezoelectric substrate; k is ½; $f_{OSC}$ equals fa $(1-\alpha)$; $f_{OSC}$ represents the oscillation frequency; fa designates the anti-resonant frequency; fr represents the resonant frequency; and n indicates a positive integer; a capacitor device including a dielectric substrate and having two individual electrodes at both sides of one main surface of the dielectric substrate and an opposing electrode which is arranged to opposedly face the individual electrodes, at the central portion of the other main surface of the dielectric substrate, the capacitor device being mounted on the mounting board so that the opposing electrode of the capacitor device is connected to the second mounting electrode of the mounting board, and the two individual electrodes of the capacitor device are connected to the first and third mounting electrodes of the mounting board and to the first and second electrodes of the resonator; and a cap fixed onto the mounting board to cover the resonator and the capacitor device, the first, second and third mounting electrodes of the mounting board being arranged to extend from an interior of the cap to an exterior of the cap.

According to a further preferred embodiment of the present invention, there is provided an electronic component including an energy-trapping thickness-shear piezoelectric resonator including a substantially rectangular sheet-like piezoelectric substrate; a first electrode disposed to extend from one end to a central portion on one surface of the piezoelectric substrate; and a second electrode disposed to extend from the other end to the central portion of the other surface of the piezoelectric substrate, the resonator utilizing thickness shear vibrations generated in a portion of the piezoelectric substrate located between the first and second electrodes at the central portion of the piezoelectric substrate, wherein the width W of the piezoelectric substrate is set to be equal to or less than about 0.7 mm and also to satisfy both of the expressions (1) and (3) or both of the expressions (2) and (3):

(1) $0 < W < kT/(1-\alpha)$ (2) $k(2n-1)T/(1-\alpha) < W < k(2n+1)T/(1-\alpha)$ (3) $0 < \alpha < (fa-fr)/fa$ where T indicates the thickness of the piezoelectric substrate; k is ½; $f_{OSC}$ equals fa $(1-\alpha)$; $f_{OSC}$ represents the oscillation frequency; fa designates the anti-resonant frequency; fr represents the resonant frequency; and n indicates a positive integer; a capacitor device including a dielectric substrate which is longer than the resonator and has two individual electrodes at both sides of one main surface of the dielectric substrate and an opposing electrode which is arranged to opposedly face the individual electrodes at the central portion of the other main surface of the substrate, the resonator being fixed to the central portion of the main surface of the capacitor device on which the individual electrodes are disposed; and first, second and third lead terminals among which the first and second lead terminals are respectively placed in stepped portions defined by both lateral surfaces of the resonator and both ends of the capacitor device and are respectively connected to the first and second electrodes of the resonator and to the individual electrodes of the capacitor device, and the third lead terminal is connected to the opposing electrode of the capacitor device.

The preferred embodiments of the present invention achieve the following advantages. The width of the resonator is set to have a predetermined range which is determined by the relationship of the width to the thickness, the constant a, the oscillation frequency, the resonant frequency and the anti-resonant frequency thereby providing a low-powered spurious response-free resonator. Moreover, it is unnecessary that the width of the resonator be varied according to the frequency range. Thus, the same capacitor device can be used without needing to change the load capacitance for the respective frequency ranges, thereby providing easy manufacturing of the oscillator.

DETAILED DESCRIPTION OF PREFERRED EMBODIMENTS

Figure 1:
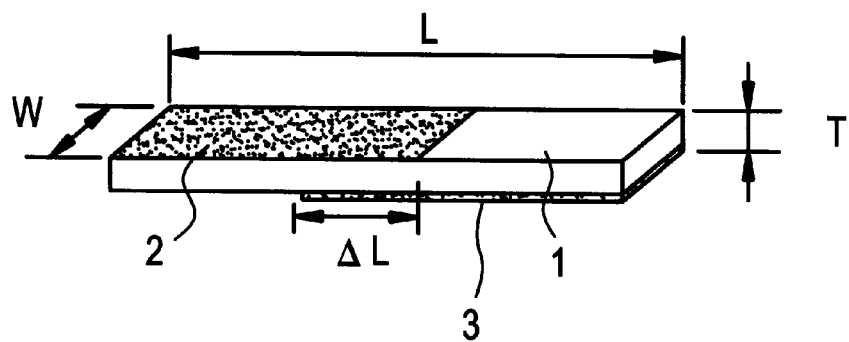
FIG. 1 is a perspective view illustrating an example of a thickness shear resonator.

Before describing the present invention in detail, the principle of the invention will first be explained.

When a ripple is produced in the frequency band, it is considered that based on the fact that the velocity of sound is fixed, the frequency constant of the thickness shear vibrations substantially matches the frequency constant of the spurious vibrations generated due to the determined width W of the oscillator. It should be taken into consideration that the vibrations caused due to the determined width W contain odd-order higher harmonics such as the third and fifth order harmonics. The ripple generated in the band produces an adverse influence when the frequency (2n+1) fa' caused due to the determined width W substantially coincides with the oscillation frequency $f_{OSC}$. Accordingly, in order to eliminate the adverse influence of the ripple, it is necessary that both of the following expressions (4) and (5) hold true. It should be noted that fa' designates the anti-resonant frequency of spurious vibrations, and n corresponds to the odd-order of the spurious vibrations superimposed on the thickness shear vibrations, for example, n=0 corresponds to the first-order spurious (width-spurious) vibration, n=1 is associated with the third-order spurious vibration, and n=2 corresponds to the fifth-order spurious vibration. The oscillation frequency $f_{OSC}$ is located between the resonant frequency fr and the anti-resonant frequency fa of shear vibrations, i.e., $fr \leq f_{OSC} \leq fa$. When a constant $\alpha$ is determined so that the oscillation frequency $f_{OSC}$ is represented by a frequency lower than the anti-resonant frequency fa by an amount equal to fa×α, the above-described relationship between the oscillation frequency $f_{OSC}$ and the anti-resonant frequency fa can be indicated by the following expressions (6) and (7).

(4) $W \times fa' \approx k \times fa \times T$ ("≈" means equal or nearly equal)

(5) $(2n+1)fa' \neq f_{OSC}$ (6) $f_{OSC} = fa(1-\alpha)$ (7) $0 < \alpha < (fa-fr)/fa$ In the above expression (4), T indicates the thickness of the piezoelectric substrate, and k designates the constant determined by the characteristics of the wave, for example, k is ½ when the longitudinal wave is generated, and k is 1 when the transverse wave is generated. Since the longitudinal wave is used in the present invention, the constant k is ½.

The foregoing expressions (4) to (6) are modified so as to be represented by expression (8).

(8) $W \neq k(2n+1)T/(1-\alpha)$

Further, expression (8) can be represented by inequality expression (9).

(9) $k(2n-1)T/(1-\alpha) < W < k(2n+1)T/(1-\alpha)$

In expression (9), n designates a positive integer including 0. If, however, n represents 0, the left side of the expression is indicated by a negative value. Thus, the following expression is used only when n indicates 0.

(10) $0 < W < k T/(1-\alpha)$

The present inventors made various analyses and studies of the occurrence of spurious responses generated in the energy-trapping thickness-shear resonator when the width W of the piezoelectric substrate used in the resonator was varied. Through the above tests and studies, it has been discovered and verified that there is substantially no spurious response generated which adversely influences the oscillation in the frequency band if both conditions indicated by expressions (9) and (7) or expressions (10) and (7) are satisfied.

Moreover, as a matter of practicality, the relationship between the oscillation frequency $f_{OSC}$ and the anti-resonant frequency fa may preferably be indicated with a range of α: $0 < \alpha < 0.1$ in consideration of the temperature characteristics, a variation in the load capacitance, and an external structure of the oscillator.

When the foregoing expressions are satisfied as discussed above, the ripple which adversely influences the oscillation can be substantially eliminated.

Figure 3:
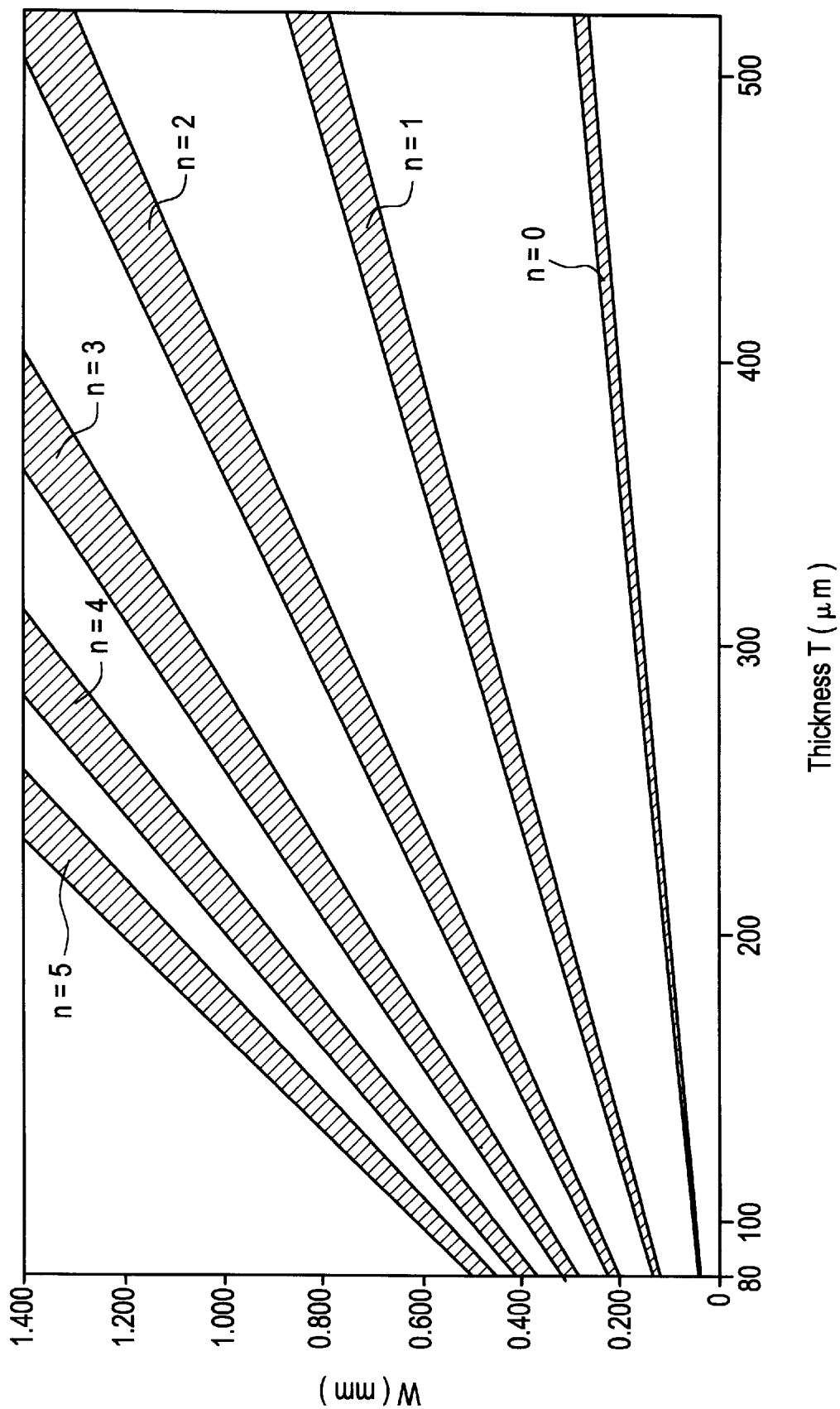
FIG. 3 is a diagram illustrating the relationship between the thickness and width of the resonator of FIG. 1.

FIG. 3 illustrates the relationship between the width W and the thickness T of the resonator indicated by expressions (1) and (2). It should be noted that α is preferably in a range: $0 < \alpha < 0.1$. The hatched portions shown in FIG. 3 indicate the regions in which the oscillator is unable to be used due to the generated spurious responses. The respective regions correspond to the orders of spurious vibrations where n indicates 0, 1, 2, 3, 4, 5, respectively.

For example, when an oscillator operable at 8 MHz is used, the thickness T of the piezoelectric substrate is approximately 150 micrometers. Accordingly, FIG. 3 shows that the width W of the substrate should be other than the widths around 0.08 mm, 0.23 mm, 0.39 mm, 0.54 mm, 0.70 mm, and 0.86 mm. The center values of the widths in which the oscillator is usable can be determined by the following equation.

$$W = nT/(1-\alpha)$$

More specifically, the center values of the usable widths in this example include 0.15 mm, 0.31 mm, 0.47 mm, 0.62 mm, and 0.78 mm. In the tests made by the present inventors, desired characteristics were obtained when the width W was set near the above values. For practical use, the advantages of the preferred embodiments of the present invention are effectively achieved when the oscillation frequency $f_{OSC}$ is equal to or higher than 3 MHz.

Figure 2:
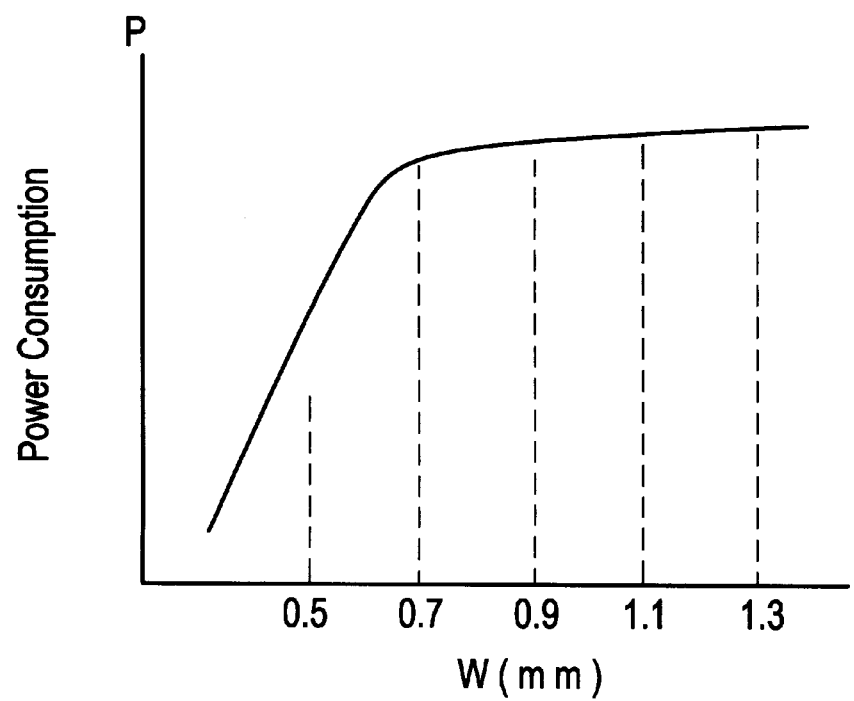
FIG. 2 is a diagram illustrating the relationship between the width and power consumption of the resonator of FIG. 1.

FIG. 2 reveals that the width of the substrate should be equal to or less than about 0.7 mm in order to achieve a low-powered oscillator. On the other hand, excessively small widths W make it difficult to machine, sheathe, and mount the piezoelectric substrate. Currently, the width W is required to be a minimum of about 0.3 mm to provide a sufficient strength for working and handling the substrate required for assembling an electronic component. Thus, the discovery of the above-described relationships by the present inventors led to the further discovery that an easy-to-machine and easy-to-mount resonator having a ripple-free impedance curve is obtained when the dimensions of the substrate are set in the following ranges.

$\Delta L = 1.1$ mm $W = 0.47$ mm

The present invention will now be explained in greater detail through illustration of preferred embodiments with reference to the drawings.

Figure 4:
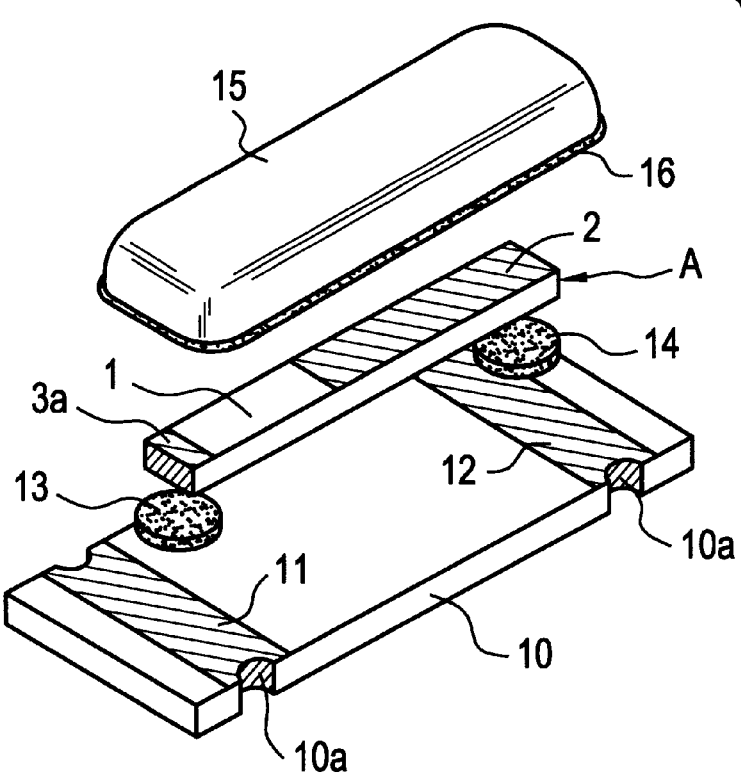
FIG. 4 is an exploded perspective view illustrating a resonator device used in a surface-mounting oscillator according to a preferred embodiment of the present invention.

FIG. 4 illustrates a resonator device A used in a surface-mounting oscillator according to a preferred embodiment of the present invention. The oscillator shown in FIG. 4 is constructed of a mounting board 10, a resonator device A, and a cap 15. The mounting board 10 is preferably formed of an insulating thin plate made from an alumina ceramic or a glass epoxy resin, and two band-like mounting electrodes 11 and 12 are provided on the top and bottom surfaces of the board 10. The ends of the electrodes 11 and 12 are respectively extended to through-hole indentations 10a located at both edges of the board 10 and are electrically connected to mounting electrodes (not shown) disposed on the bottom surface of the board 10 via electrodes disposed in the respective through-hole indentations 10a.

Figure 5:
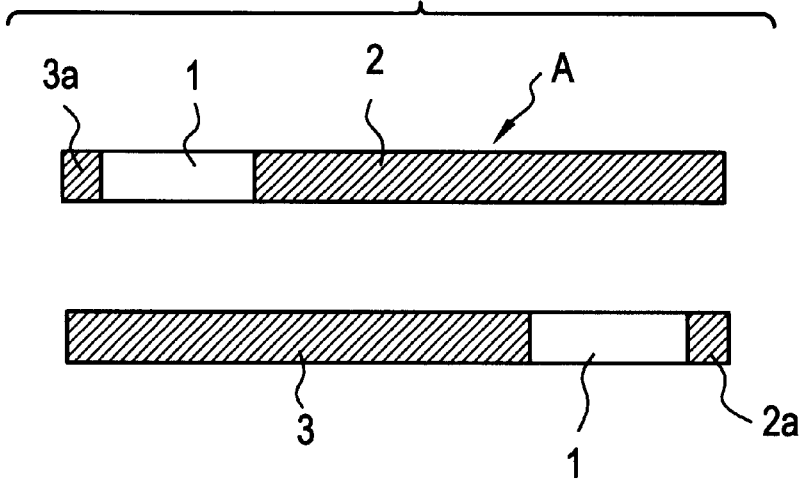
FIG. 5 illustrates the top and bottom surfaces of the resonator device.

The resonator device A is bonded onto the electrodes 11 and 12 by means of joining materials 13 and 14 having both conductive and adhesive functions, such as a conductive adhesive or solder. A vibration space is securely provided between the resonator device A and the board 10 due to the thickness of the joining materials 13 and 14. For reliably connecting the resonator device A to the electrodes 11 and 12 of the board 10, the ends 2a and 3a of the respective electrodes 2 and 3 of the device A may preferably be extended, as illustrated in FIG. 5, to the surfaces opposite to the surfaces provided with the electrodes 2 and 3 of the piezoelectric substrate 1 via both lateral or end surfaces of the piezoelectric substrate 1. In this case, the conductive adhesives 13 and 14 are applied to the board 10 preferably by means such as printing so as to have a certain thickness, and then, the resonator device A is bonded to the board 10, thereby simply and reliably establishing an electrical connection between the electrodes 2 and 3 of the device A and the mounting electrodes 11 and 12.

The cap 15 is bonded onto the board 10 preferably by an adhesive 16 to cover the resonator device A. In this preferred embodiment, the cap 15 is preferably produced by deep-drawing a metal sheet in a "U" shape in longitudinal cross section, but may be formed by coining or die casting. As the adhesive 16, epoxy, epoxy-acrylate, or silicone adhesive may be used to provide desired heat resistance and chemical resistance, and above all, epoxy adhesive is preferably used to provide a desired amount of adhesion with the cap 15 and because of its low cost. After the bottom surface of the cap 15 is coated with the adhesive 16 by transferring, it is bonded onto the board 10, and the adhesive 16 is cured, thereby easily sealing the inside of the cap 15.

Since the width of the resonator device A constructed in accordance with the preferred embodiments of the present invention is minimal, the width of the surface-mounting oscillator incorporating the resonator device A can also be decreased. Further, only a small amount of power is required in this oscillator, thereby achieving miniaturized and lower-powered mobile communication equipment.

Figure 6:
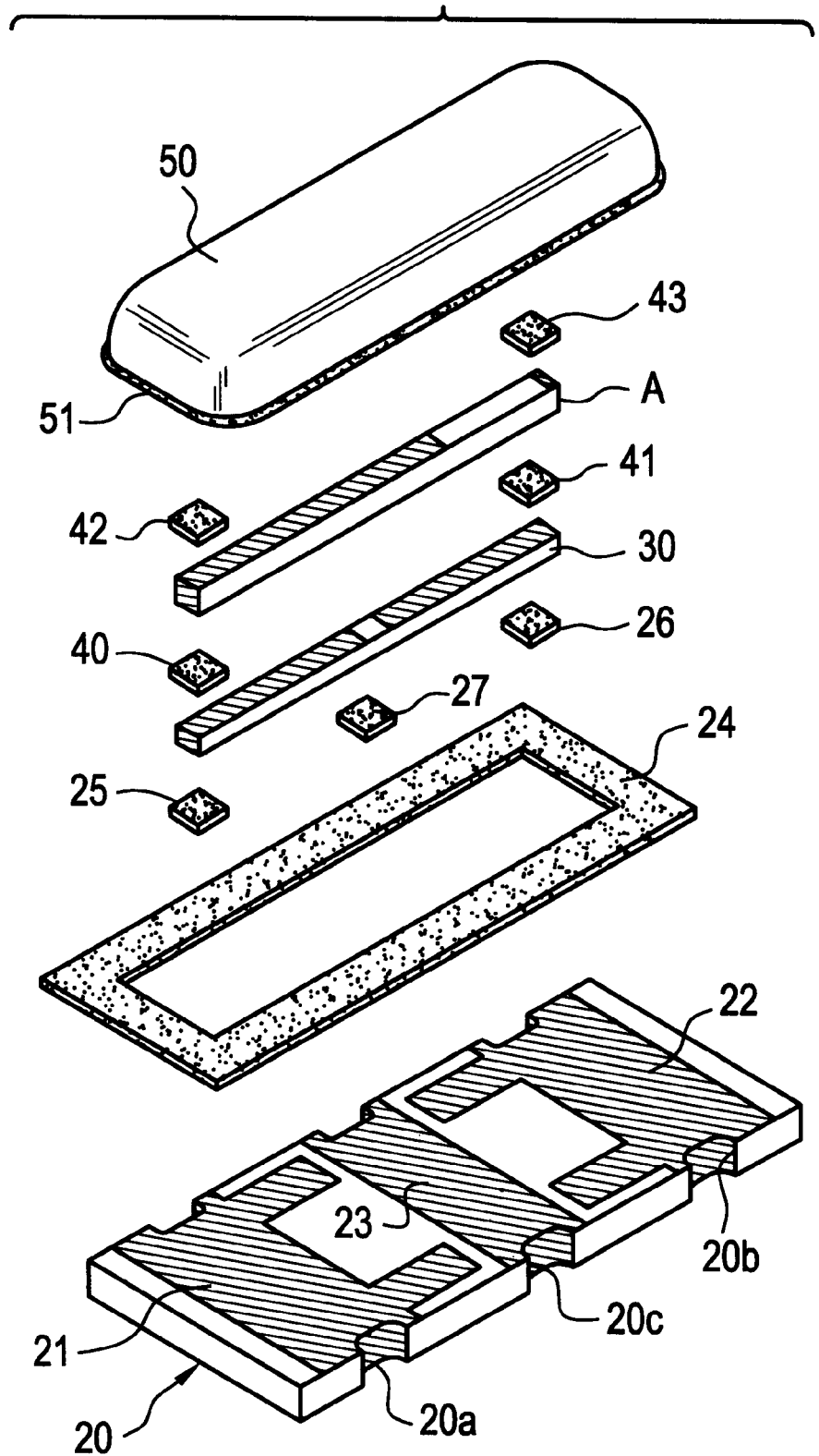
FIG. 6 is an exploded perspective view of a resonator device used in a surface-mounting and load-capacitor-integrating oscillator according to another preferred embodiment of the present invention.

FIG. 6 illustrates the resonator device A used in a surface-mounting and load-capacitance-integrating oscillator according to another preferred embodiment of the present invention. This oscillator is preferably used in a Colpitts oscillation circuit and preferably includes one resonator device A and two capacitors.

A mounting board 20, which is preferably made of an alumina ceramic, has three mounting electrodes 21, 22 and 23 at both end portions and in the central portion of the top and bottom surfaces of the board 20. The end portions of the electrodes 21, 22 and 23 are extended to through-hole indentations 20a, 20b and 20c provided at both edges of the board electrodes 21, 22 and 23, respectively, thereby establishing an electrical connection between the electrodes 21, 22 and 23 provided on the top surface and the electrodes formed on the bottom surface of the board 20. A frame-like insulating layer 24 having a shape and position corresponding to that of the bonding portion of a cap 50 has a certain thickness and is disposed on the electrodes 21, 22 and 23 of the board 20.

Figure 7:
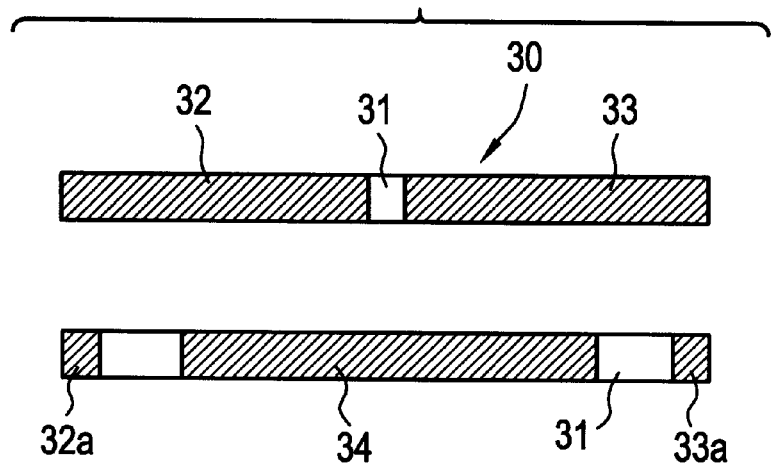
FIG. 7 illustrates the top and bottom surfaces of a capacitor device.

By means of film-like conductive materials 25, 26 and 27 preferably having both conductive and adhesive functions, such as a conductive adhesive, the resonator device A and a capacitor device 30 integrally laminated to each other are bonded onto the board 20. The capacitor device 30 includes, as shown in FIG. 7, a dielectric substrate (for example, a ceramic substrate) 31 preferably having substantially the same length and width as the resonator device A. Two individual electrodes 32 and 33 extend from both ends to the central portion of the top surface of the device 30, and one opposing electrode 34 is arranged to face the individual electrodes 32 and 33 at the central portion of the bottom surface of the device 30. Two capacitors are defined by the opposing portions formed by the opposing electrode 34 and the respective individual electrodes 32 and 33. Partial portions 32a and 33a of the individual electrodes 32 and 33 are provided at both ends of the device 30, respectively, so as to extend to the bottom surface of the device 30 via the lateral or end surfaces of the dielectric substrate 31.

The bottom surface of the resonator device A and the top surface of the capacitor device 30 are bonded to each other by means of joining materials 40 and 41 having both conductive and adhesive functions, such as a conductive adhesive, at both ends of the devices A and 30. More specifically, the electrodes 2 and 3 disposed on the lower surface of the resonator device A are electrically connected to the electrodes 32 and 33, respectively, located on the upper surface of the capacitor device 30. Moreover, a vibration space is defined between the vibrating portion of the resonator device A and the capacitor device 30 due to the thickness of the materials 40 and 41. It should be noted that damping materials 42 and 43, such as resin, for frequency adjustments, are preferably applied to both ends of the bottom surface of the resonator device A.

The resonator device A and the capacitor device 30 which are integrally laminated to each other as discussed above are fixed onto the board 20 via application of the film-like conductive materials 25, 26 and 27 to the capacitor device 30, so that the individual electrodes 32 and 33 of the capacitor device 30 are electrically and physically connected to the mounting electrodes 21 and 22, respectively, provided on the board 20, and the opposing electrode 34 is connected to the mounting electrode 23. By virtue of the partial electrodes 32a and 33a, which are located at both ends of the bottom surface of the capacitor device 30 and are electrically connected to the individual electrodes 32 and 33, respectively, the individual electrodes 32 and 33 can be reliably and securely connected to the electrodes 21 and 22, respectively, on the board 20 via the conductive materials 25 and 26.

An integral structure of the resonator device A and the capacitor device 30 can be readily fabricated by, for example, bonding a mother board having the resonator device A disposed thereon to a mother board having the capacitor device 30 including the materials 40 and 41 and cutting the integrated structure to the required size of the device.

A cap 50 is fixed onto the board 20 preferably via an adhesive 51 to cover the resonator device A and the capacitor device 30. A material of the type similar to that of the cap 15 described in the previous preferred embodiment shown in FIG. 4 is preferably used for the cap 50. The adhesive 51 also includes a material of the type similar to that discussed in the preferred embodiment illustrated in FIG. 4. After the bottom surface of the cap 50 is coated with the adhesive 51 by transferring, the cap 50 is bonded onto the insulating layer 24, and the adhesive 51 is cured.

Although in the foregoing preferred embodiments the capacitors are defined by the capacitor device 30, capacitors may be directly provided on the mounting board 20 in the following manner. Capacitor electrodes may be disposed on the mounting board 20 on which a dielectric layer may be deposited, and then capacitor electrodes may further be disposed on the dielectric layer.

Figure 8:
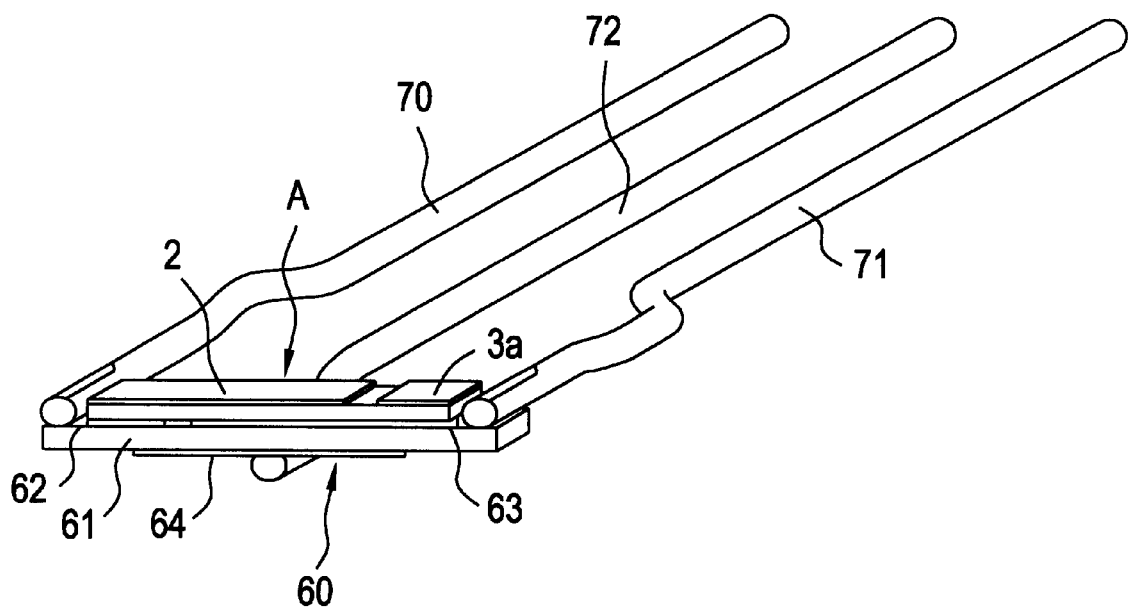
FIG. 8 is a perspective view illustrating a resonator device used in a lead-terminal-type and load-capacitor-integrating oscillator according to a further preferred embodiment of the present invention.

FIG. 8 illustrates a resonator device A used in a lead-terminal-type and load-capacitor-integrating oscillator according to a further preferred embodiment of the present invention. In FIG. 8, there are shown a capacitor device 60 and lead terminals 70, 71 and 72. Although round bar-like lead terminals are used in this preferred embodiment, flat lead terminals may be used.

In the capacitor device 60, two individual electrodes 62 and 63 are provided at both ends of one main surface of a dielectric substrate 61, which is made of, for example, a ceramic, while an opposing electrode 64 opposedly facing the individual electrodes 62 and 63 is provided at the central portion of the other main surface of the substrate 61. The provision of partial electrodes electrically connected to the individual electrodes on the bottom surface of the substrate 61, such as those illustrated in FIG. 7, may be omitted from the capacitor device 60. Although the width of the capacitor device 60 is preferably substantially the same as the width of the resonator device A, the length of the capacitor device 60 is longer than the length of the resonator device A, and the resonator device A is bonded with a conductive adhesive (not shown) to the central portion of the main surface of the capacitor device 60 on which the individual electrodes 62 and 63 are disposed. Accordingly, the electrodes 2 and 3 provided on the resonator device A are electrically connected to the individual electrodes 62 and 63, respectively. A predetermined vibration space is reliably provided between the central portion of the resonator device A and the capacitor device 60 by the joining materials as described above with respect to the other preferred embodiments.

The forward ends of the three lead terminals 70, 71 and 72 are pressed in a somewhat flat shape, and the forward ends of the lead terminals 70 and 71 at both sides are placed in and soldered to stepped portions formed by both lateral surfaces of the resonator device A and both ends of the capacitor device 60. The stepped portions are formed as a result of the difference in length between the resonator A and the capacitor device 60. The solder at one side covers the lead terminal 70, the electrode 2 of the resonator device is A, and the individual electrode 62 of the capacitor device 60, thereby securely connecting these three elements. The solder at the other side covers the lead terminal 71, the electrode 3 of the resonator device A, and the individual electrode 63 of the capacitor device 60, thereby reliably connecting these three elements. Further, the central lead terminal 72 is soldered to the opposing electrode 64 of the capacitor device 60.

As described above, solder serves the function of connecting the lead terminal 70, the electrode 2 of the resonator device A, and the individual electrode 62 of the capacitor device 60 and also separately connecting the lead terminal 71, the electrode 3, and the individual electrode 63. Accordingly, an insulating adhesive in place of a conductive adhesive may be used for bonding the resonator device A to the capacitor device 60. The resonator device A, the capacitor device 60, and the forward ends of the lead terminals 70, 71 and 72 are sheathed with a dipping resin or a resin casing.

In this preferred embodiment, the capacitor device 60 serves not only as a circuit device, but also as a reinforcing plate for the resonator device A. Thus, even if the width of the resonator device A is minimal, the capacitor device 60 can protect the resonator device A from fractures.

A composite-type oscillator formed by combining the resonator device A and the capacitor device 60 has been explained in the preferred embodiment illustrated in FIG. 8. The present invention however is not restricted to the above type, and a reinforcing plate may be simply used instead of the capacitor device 60. In this case, since the present invention is used as a two-terminal oscillator without a load capacitor, the central lead terminal 72 is simply omitted.

The present invention is not limited to the foregoing preferred embodiments. As the piezoelectric substrate used for the resonator, a single-crystal substrate made of, for example, LT or LN or other suitable material, may be used in place of a ceramic substrate made of, for example, PZT or PbTiO$_3$.

Although the present invention has been described in relation to particular embodiments thereof, many other variations and modifications and other uses will become apparent to those skilled in the art. It is preferred, therefore, that the specific disclosure herein, but only by the appended claims.

What is claimed is:

1. An energy-trapping thickness-shear piezoelectric resonator comprising:

a piezoelectric substrate;

a first electrode extending from a first end to a central portion on a first surface of said piezoelectric substrate; and a second electrode extending from a second end to the central portion of a second surface of said piezoelectric substrate, said resonator utilizing thickness shear vibrations generated in a portion of the piezoelectric substrate located between said first and second electrodes at the central portion of said piezoelectric substrate;

wherein a width W of said piezoelectric substrate is set to be equal to or less than about 0.7 mm and also to satisfy both expressions (1) and (3) or to satisfy both expressions (2) and (3):

$0 < W < k\ T/(1-\alpha)$ $k(2n-1)T/(1-\alpha) < W < k(2n+1)T/(1-\alpha)$ $0 < \alpha < (fa-fr)/fa$ where T indicates a thickness of said piezoelectric substrate; k is ½; $f_{OSC}$ equals fa $(1-\alpha)$ ; $f_{OSC}$ represents an oscillation frequency of the resonator; fa designates an anti-resonant frequency of the resonator; fr represents a resonant frequency of the resonator; $\alpha$ is a constant and n indicates a positive integer.

2. An energy-trapping thickness-shear piezoelectric resonator according to claim 1, wherein a value of $\alpha$ is within a range of $0 < \alpha 0.1$.

3. An electronic component comprising:

an insulating mounting board having at least two mounting electrodes disposed at least on an upper surface of said board;

an energy-trapping thickness-shear piezoelectric resonator including a piezoelectric substrate, a first electrode extending from a first end to a central portion on a first surface of said piezoelectric substrate, and a second electrode extending from a second end to the central portion of a second surface of said piezoelectric substrate, said resonator utilizing thickness shear vibrations generated in a portion of the piezoelectric substrate located between said first and second electrodes at the central portion of said piezoelectric substrate, wherein a width W of said piezoelectric substrate is set to be equal to or less than about 0.7 mm and also to satisfy both expressions (1) and (3) or to satisfy both expressions (2) and (3):

(1) $0<W<k\ T/(1-\alpha)$ (2) $k(2n-1)T/(1-\alpha)<W<k(2n+1)T/(1-\alpha)$ $0<\alpha<(fa-fr)/fa$ where T indicates a thickness of said piezoelectric substrate; k is ½; $f_{OSC}$ equals fa $(1-\alpha)$; $f_{OSC}$ represents an oscillation frequency of the resonator; fa designates an anti-resonant frequency of the resonator; fr represents a resonant frequency of the resonator; $\alpha$ is a constant and n indicates a positive integer, said resonator being mounted on said mounting board so that said first electrode and said second electrode of said resonator are respectively electrically connected to said mounting electrodes of said mounting board; and a cap fixed onto said mounting board to cover said resonator, said mounting electrodes of said mounting board being arranged to extend form an interior to an exterior of said cap.

4. An electronic component according to claim 3, wherein a value of $\alpha$ is within a range of $0<\alpha<0.1$.

5. An electronic component comprising:

an insulating mounting board having at least first, second and third mounting electrodes disposed at least on an upper surface of said board;

an energy-trapping thickness-shear piezoelectric resonator including a piezoelectric substrate, a first electrode extending from a first end to a central portion on a first surface of said piezoelectric substrate, and a second electrode extending from a second end to the central portion of a second surface of said piezoelectric substrate, said resonator utilizing thickness shear vibrations generated in a portion of said piezoelectric substrate located between said first and second electrodes at the central portion of said piezoelectric substrate, wherein a width W of said piezoelectric substrate is set to be equal to or less than about 0.7 mm and also to satisfy both expressions (1) and (3) or to satisfy both expressions (2) and (3):

(1) $0<W<k\ T/(1-\alpha)$ (2) $k(2n-1)T/(1-\alpha)<W<k(2n+1)T/(1-\alpha)$ $0<\alpha<(fa-fr)/fa$ where T indicates a thickness of said piezoelectric substrate; k is ½; $f_{OSC}$ equals fa $(1-\alpha)$ ; $f_{OSC}$ represents an oscillation frequency of the resonator; fa designates the anti-resonant frequency of the resonator; fr represents a resonant frequency of the resonator; $\alpha$ is a constant and n indicates a positive integer;

a capacitor device including a dielectric substrate having two individual electrodes disposed at both sides of one main surface of said dielectric substrate and an opposing electrode arranged to oppositely face said two individual electrodes, at a central portion of the other main surface of said dielectric substrate, said capacitor device being mounted on said mounting board so that said opposing electrode of said capacitor device is electrically connected to said second mounting electrode of said mounting board, and said two individual electrodes of said capacitor device electrically are connected to said first and third mounting electrodes of said mounting board and to said first and second electrodes of said resonator; and a cap fixed onto said mounting board to cover said resonator and said capacitor device, said first, second and third mounting electrodes of said mounting board being arranged to extend from an interior to an exterior of said cap.

6. An electronic component according to claim 5, wherein a value of $\alpha$ is within a range of $0<\alpha<0.1$.

7. An electronic component comprising:

an energy-trapping thickness-shear piezoelectric resonator including a piezoelectric substrate, a first electrode extending from a first end to a central portion on a first surface of said piezoelectric substrate, and a second electrode extending from the a second end to the central portion of a second surface of said piezoelectric substrate, said resonator utilizing thickness shear vibrations generated in a portion of said piezoelectric substrate located between said first and second electrodes at the central portion of said piezoelectric substrate, wherein a width W of said piezoelectric substrate is set to be equal to or less than about 0.7 mm and also to satisfy both expressions (1) and (3) or to satisfy both expressions (2) and (3):

(1) $0<W<k\ T/(1-\alpha)$ (2) $k(2n-1)T/(1-\alpha)<W<k(2n+1)T/(1-\alpha)$ $0<\alpha<(fa-fr)/fa$ where T indicates a thickness of said piezoelectric substrate; k is ½; $f_{OSC}$ equals fa $(1-\alpha)$; $f_{OSC}$ represents the an oscillation frequency of the resonator; fa designates an anti-resonant frequency of the resonator; fr represents a resonant frequency of the resonator; $\alpha$ is a constant and n indicates a positive integer;

a capacitor device including a dielectric substrate which is longer than said resonator and having two individual electrodes disposed at both sides of a first main surface of said dielectric substrate and an opposing electrode arranged to oppositely face said two individual electrodes of said capacitor device at a central portion of a second main surface of said dielectric substrate, said resonator being fixed to the central portion of the main surface of said capacitor device on which said individual electrodes are disposed; and first, second and third lead terminals among which said first and second lead terminals are respectively disposed in stepped portions defined by both lateral surfaces of said resonator and both ends of said capacitor device and are electrically connected to said first and second electrodes of said resonator and to said individual electrodes of said capacitor device, and said third lead terminal is electrically connected to said opposing electrode of said capacitor device.

8. An electronic component according to claim 7, wherein a value of a is within a range of $0<\alpha<0.1$.

* * * * *